(12) United States Patent
Ando et al.

(10) Patent No.: US 8,592,296 B2
(45) Date of Patent: Nov. 26, 2013

(54) GATE-LAST FABRICATION OF QUARTER-GAP MGHK FET

(75) Inventors: Takashi Ando, Tuckahoe, NY (US);
Kisik Choi, Hopwell Junction, NY (US);
Vijay Narayanan, New York, NY (US);
Tenko Yamashita, Schenectady, NY (US); Junli Wang, Slingerlands, NY (US)

(73) Assignees: International Business Machines Corporation, Armonk, NY (US);
GlobalFoundries Inc. (KY)

( * ) Notice: Subject to any disclaimer, the term of this patent is extended or adjusted under 35 U.S.C. 154(b) by 214 days.

(21) Appl. No.: 12/816,605

(22) Filed: Jun. 16, 2010

(65) Prior Publication Data
US 2011/0309455 A1    Dec. 22, 2011

(51) Int. Cl.
*H01L 21/3205*    (2006.01)

(52) U.S. Cl.
USPC ............................................ 438/591; 257/410

(58) Field of Classification Search
USPC .......... 438/591, 216, 217, 260, 287; 257/410
See application file for complete search history.

(56) References Cited

U.S. PATENT DOCUMENTS

| | | | | |
|---|---|---|---|---|
| 7,229,893 B2 * | 6/2007 | Wang et al. | ..................... | 438/424 |
| 7,279,416 B2 * | 10/2007 | Seo et al. | ..................... | 438/648 |
| 2006/0084247 A1 * | 4/2006 | Liu | ............................... | 438/510 |
| 2008/0224185 A1 * | 9/2008 | Samavedam et al. | ......... | 257/288 |
| 2008/0224235 A1 * | 9/2008 | Lavoie et al. | ................ | 257/407 |
| 2009/0039435 A1 | 2/2009 | Doris et al. | | |

* cited by examiner

*Primary Examiner* — Julio J Maldonado
*Assistant Examiner* — Robert Bachner
(74) *Attorney, Agent, or Firm* — Cantor Colburn LLP; Vazken Alexanian

(57) ABSTRACT

A quarter-gap p-type field effect transistor (PFET) formed by gate-last fabrication includes a gate stack formed on a silicon substrate, the gate stack including: a high-k dielectric layer located on the silicon substrate; and a gate metal layer located over the high-k dielectric layer, the gate metal layer including titanium nitride and having a thickness of about 20 angstroms; and a metal contact formed over the gate stack. A quarter-gap n-type field effect transistor (NFET) formed by gate-last fabrication includes a gate stack formed on a silicon substrate, the gate stack including: a high-k dielectric layer located on the silicon substrate; and a first gate metal layer located over the high-k dielectric layer, the first gate metal layer including titanium nitride; and a metal contact formed over the gate stack.

15 Claims, 7 Drawing Sheets

_US 8,592,296 B2_

GATE-LAST FABRICATION OF QUARTER-GAP MGHK FET

FIELD

This disclosure relates generally to the field of integrated circuit fabrication, and more particularly to obtaining a desired workfunction in a metal gate high-k (MGHK) field effect transistor (FET) using a gate-last fabrication process.

DESCRIPTION OF RELATED ART

Integrated circuits (ICs) include many types of devices, such as field effect transistors (FETs), which may include p-type field effect transistors (PFETs) and n-type field effect transistors (NFETs). The mainstay material of IC fabrication is silicon (Si) and silicon-based materials. As device sizes are being scaled down, IC technology becomes more complex, and changes in device structures and new fabrication methods are needed to maintain expected performance enhancements from one generation of devices to the next. Reduction of power consumption in successive generations of ICs is also important for many applications, such as use of ICs in mobile, battery-powered devices, allowing for extended battery life. A FET device may include a MGHK FET, with a gate including a gate metal layer and a high-k dielectric gate dielectric layer A FET gate may be formed using a gate-first process, or a gate-last process. Gate-first refers to a fabrication process in which the FET gate is formed before device activation, which may include a high temperature anneal (about 1000° C. or higher). In a gate-last fabrication process, the FET gate is formed after device activation, in order to avoid heating the gate materials during activation. A gate-last fabrication process may be used to form quarter-gap MGHK NFETs and PFETs; however, such a process may require use of different metals for PFET and NFET gate metal layers, resulting in a relatively complex fabrication process.

SUMMARY

In one aspect, a method of gate-last fabrication for a field effect transistor (FET) includes forming a gate stack on a silicon substrate, the gate stack including: a high-k dielectric layer located on the silicon substrate; and a first gate metal layer located over the high-k dielectric layer, the first gate metal layer including titanium nitride; forming a polysilicon layer over the gate stack; annealing the gate stack and the silicon substrate; removing the polysilicon layer; and forming a metal contact over the gate stack.

In one aspect, a quarter-gap p-type field effect transistor (PFET) formed by gate-last fabrication includes a gate stack formed on a silicon substrate, the gate stack including: a high-k dielectric layer located on the silicon substrate; and a gate metal layer located over the high-k dielectric layer, the gate metal layer including titanium nitride and having a thickness of about 20 angstroms; and a metal contact formed over the gate stack.

In one aspect, a quarter-gap n-type field effect transistor (NFET) formed by gate-last fabrication includes a gate stack formed on a silicon substrate, the gate stack including: a high-k dielectric layer located on the silicon substrate; and a first gate metal layer located over the high-k dielectric layer, the first gate metal layer including titanium nitride; and a metal contact formed over the gate stack.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a method of gate-last fabrication of a quarter-gap MGHK FET are provided, with exemplary embodiments being discussed below in detail. A quarter-gap MGHK FET (NFET or PFET) including a titanium nitride (TiN) gate metal layer of an appropriate thickness may be formed using a gate-last fabrication process. As the TiN gate metal layer thickness varies from about 20 angstroms to greater than about 35 angstroms thick, there is a marked change in the FET workfunction after device activation anneal and removal of the top polysilicon layer. This allows for gate-last fabrication of a quarter-gap NFET, mid-gap FET, or a quarter-gap PFET MGHK devices by varying the thickness of the gate metal layer. The effective work function of a quarter-gap NFET device may be about 4.325 electron-volts (eV), the effective work function of a midgap FET device may be about 4.600 eV, and the effective work function of a quarter-gap PFET may be about 4.875 eV. The desired workfunction for a finished FET device may be obtained by adjusting the thickness of the TiN gate metal layer. The gate stack may further include a threshold voltage ($V_t$) tuning cap layer, an oxygen barrier layer, and/or an additional gate metal layer in some embodiments; the presence of such layers may affect the required thickness of the gate metal layer necessary to obtain the desired FET workfunction.

Figure 1:
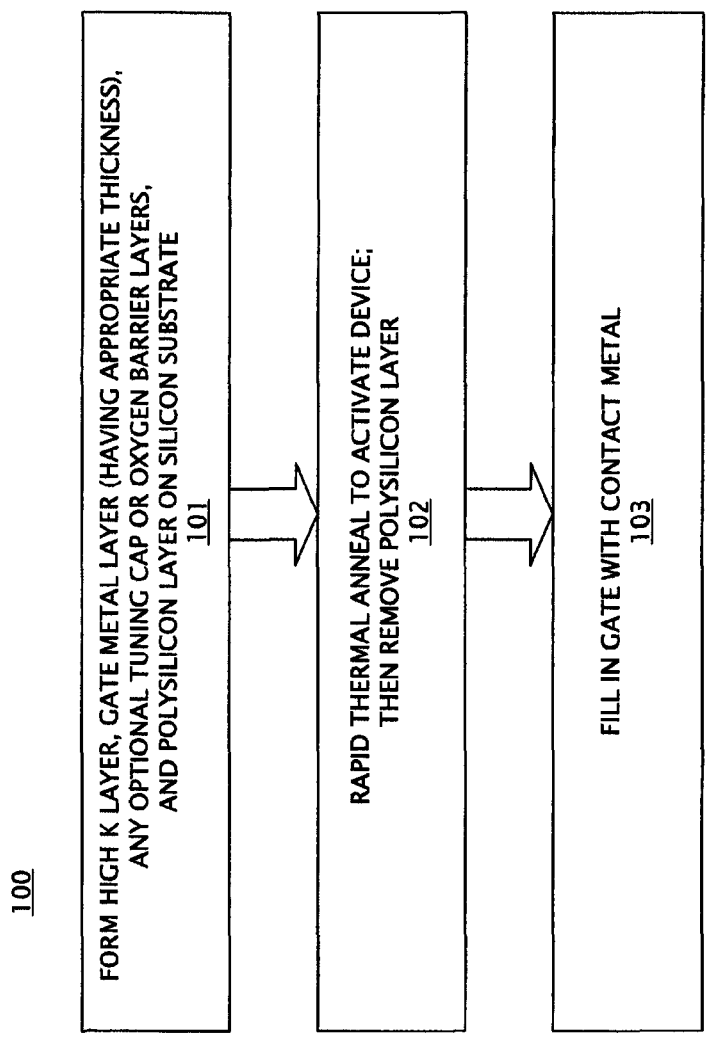
FIG. 1 illustrates an embodiment of a method of method of gate-last fabrication a quarter-gap MGHK FET.
Figure 2:
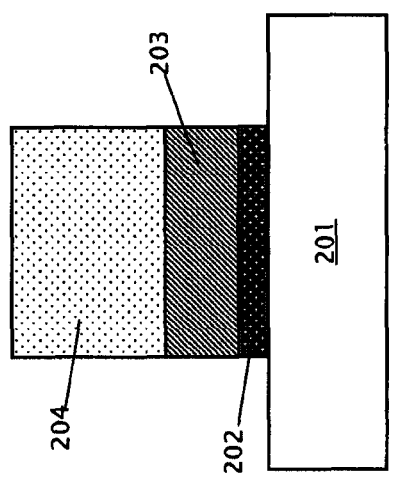
FIG. 2 illustrates an embodiment of a gate stack formed on a silicon substrate.

FIG. 1 illustrates an embodiment of a method of gate-last fabrication a quarter-gap MGHK FET. FIG. 1 is discussed with reference to FIGS. 2-7. In block 101, a gate stack is formed on a Si substrate 201, as is shown in device 200 of FIG. 2. In the embodiment of FIG. 2, the gate stack includes a high-k dielectric layer 202 and a gate metal layer 203; a top polysilicon layer 204 is formed over the gate stack. The gate stack is located on Si substrate 201. High-k dielectric layer 202 may include hafnium oxide in some embodiments. Gate metal layer 203 is TiN. The thickness of the gate metal layer 203 may vary, based on the type of device (quarter-gap NFET, mid-gap FET, or quarter-gap PFET) being fabricated; the gate metal layer 203 may have a thickness ranging from about 20 angstroms up to greater than 35 angstroms in some embodiments. The gate stack formed in block 101 may additionally include a threshold voltage tuning cap layer, one or more oxygen barrier layers, and/or an additional gate metal layer in some embodiments; such embodiments are discussed in further detail below with respect to FIGS. 5-7.

In block 102, device activation is performed by annealing the device 200. The anneal may have a minimum temperature of about 1000° C. in some embodiments. After the anneal is completed, top polysilicon layer 204 is removed selective to gate metal layer 202, resulting in the device 300 shown in FIG. 3, including high-k dielectric layer 202 and gate metal layer 203 on silicon substrate 201.

Figure 3:
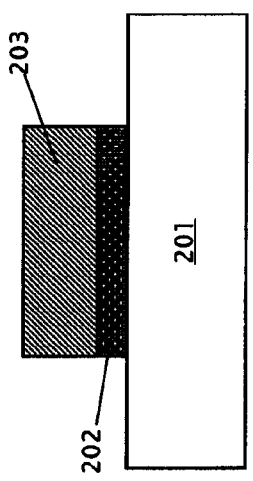
FIG. 3 illustrates an embodiment of the device of FIG. 2 after device activation and removal of the top polysilicon layer.
Figure 4:
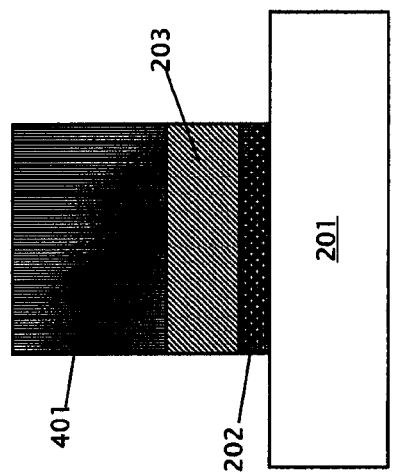
FIG. 4 illustrates an embodiment of the device of FIG. 3 after formation of a metal contact.

In block 103, a metal contact 401 is formed over the gate stack of the device of FIG. 3, resulting in MGHK FET 400 as shown in FIG. 4. Metal contact 401 may include aluminum (Al) or tungsten (W) in some embodiments. MGHK FET 400 includes silicon substrate 201, high-k dielectric layer 202, gate metal layer 203, and metal contact 401. MGHK FET 400 may include a quarter-gap NFET, a quarter-gap PFET, or a mid-gap FET, depending on the thickness of gate metal layer 203. In embodiments in which gate metal layer 203 is about 20 angstroms thick, MGHK FET 400 is a quarter-gap PFET. In embodiments in which gate metal layer 203 is from about 20 angstroms to about 35 angstroms thick, MGHK FET 400 is a mid-gap FET. In embodiments in which gate metal layer from about 35 angstroms thick to about 100 angstroms thick, MGHK FET 400 is a quarter-gap NFET.

Figure 5:
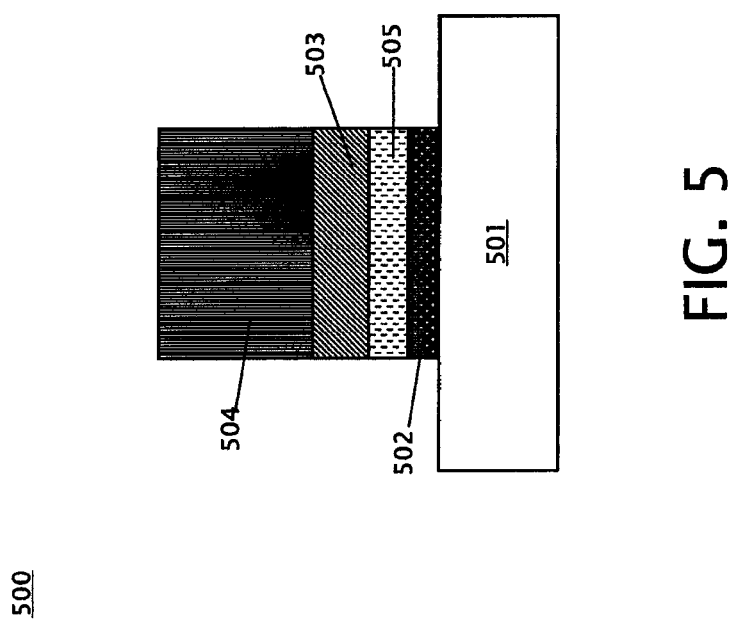
FIG. 5 illustrates an embodiment of an activated FET device formed by the method of FIG. 1.

In some embodiments, an MGHK FET 500 formed by the gate-last method of FIG. 1 may include a threshold voltage tuning cap layer 505 formed between the high-k dielectric layer 502 and the gate metal layer 503, as is shown in FIG. 5. The gate stack including high-k dielectric layer 502, threshold voltage tuning cap layer 505, and gate metal layer 503 is formed with a top polysilicon layer (not shown) on silicon substrate 501 before device activation in block 102 of FIG. 1. MGHK FET 500 further includes metal contact 504 that is formed over gate metal layer 503 after device activation and removal of the top polysilicon layer. Metal contact 504 may include Al or W in some embodiments. High-k dielectric layer 502 may include hafnium oxide in some embodiments. Gate metal layer 503 is TiN. Threshold voltage tuning cap layer 505 may include Al, lanthanum (La), or magnesium (Mg) in some embodiments. In embodiments in which gate metal layer 503 is from about 35 angstroms thick to about 100 angstroms thick, and threshold voltage tuning cap layer 505 includes Al, MGHK FET 500 is a mid-gap FET. In embodiments in which gate metal layer 503 is about 20 angstroms thick, and threshold voltage tuning cap layer 505 includes a relatively thick La layer (having a thickness from about 4 angstroms to about 100 angstroms), MGHK FET 500 is a quarter-gap NFET. In embodiments in which gate metal layer 503 is about 20 angstroms thick, and threshold voltage tuning cap layer 505 includes a relatively thin La layer (having a thickness from about 1 angstrom to about 4 angstroms in some embodiments), MGHK FET 500 is a mid-gap FET.

Figure 6:
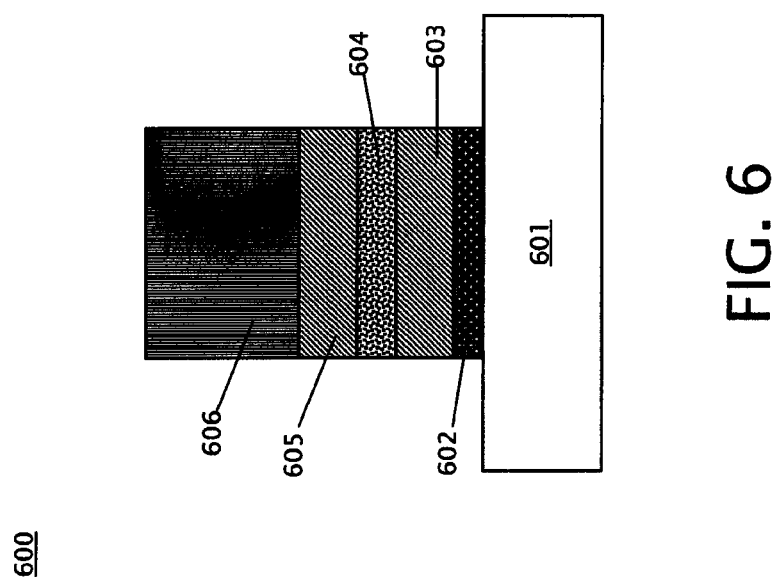
FIG. 6 illustrates an embodiment of an activated FET device formed by the method of FIG. 1.

In some embodiments, an MGHK FET device 600 formed by the gate-last method of FIG. 1 may include an oxygen barrier layer 604 located between a first gate metal layer 603 and a second gate metal layer 605, as shown in FIG. 6. MGHK FET 600 includes a gate stack including high-k dielectric layer 602, first gate metal layer 603, oxygen barrier layer 604, and second gate metal layer 605, which is formed with a top polysilicon layer (not shown) on silicon substrate 601 before device activation in block 102 of FIG. 1. MGHK FET 600 further includes metal contact 606 that is formed over second gate metal layer 605 after device activation and removal of the top polysilicon layer. Metal contact 606 may include Al or W in some embodiments. High-k dielectric layer 602 may include hafnium oxide in some embodiments. First gate metal layer 603 and second gate metal layer 605 are TiN. Oxygen barrier layer 604 may include tantalum nitride (TaN) deposited via atomic layer deposition (ALD) in some embodiments, or may be deposited by physical vapor deposition (PVD) in other embodiments. In embodiments in which first gate metal layer 603 is about 20 angstroms thick, and second gate metal layer 605 is from about 35 angstroms to about 100 angstroms thick, MGHK FET 600 includes a quarter-gap NFET. In such an embodiment, the second gate metal layer 605 and oxygen barrier layer 604 may be selectively removed before formation of a metal contact in order to form a quarter-gap PFET device including high-k dielectric layer 602 and first gate metal layer 603 (which is about 20 angstroms thick), such as is discussed above with reference to FIG. 4.

Figure 7:
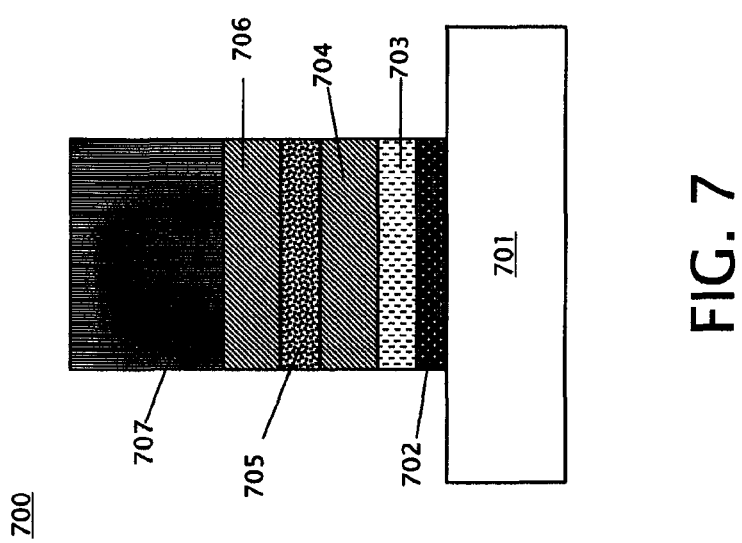
FIG. 7 illustrates an embodiment of an activated FET device formed by the method of FIG. 1.

In some embodiments, an MGHK FET 700 formed by the gate-last method of FIG. 1 may include a threshold voltage tuning cap layer 703 and an oxygen barrier layer 705, as shown in FIG. 7. MGHK FET 700 includes a gate stack including high-k dielectric layer 702, threshold voltage tuning cap layer 703, first gate metal layer 704, oxygen barrier layer 705, and second gate metal layer 706, which is formed with a top polysilicon layer (not shown) on silicon substrate 701 before device activation in block 102 of FIG. 1. MGHK FET 700 further includes metal contact 707 that is formed over second gate metal layer 706 after device activation and removal of the top polysilicon layer. Metal contact 707 may include Al or W in some embodiments. High-k dielectric layer 702 may include hafnium oxide in some embodiments. First gate metal layer 704 and second gate metal layer 706 are TiN. Oxygen barrier layer 705 may include tantalum nitride (TaN) deposited via ALD in some embodiments, or may be deposited by PVD in other embodiments. In embodiments in which first gate metal layer 704 is about 20 angstroms thick, second gate metal layer 706 is from about 35 angstroms to about 100 angstroms thick, and threshold voltage tuning cap layer 703 includes Al, MGHK FET 700 includes a mid-gap FET. In embodiments in which first gate metal layer 704 is about 20 angstroms thick and oxygen barrier layer 705 and second gate metal layer 706 are removed, a threshold voltage tuning cap layer 703 including La or Mg is employed to obtain a mid-gap FET.

The technical effects and benefits of exemplary embodiments include formation of a quarter-gap MGHK NFET and PFET devices using a gate-last fabrication process.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of gate-last fabrication for a field effect transistor (FET), the method comprising:
    forming a gate stack on a silicon substrate, the gate stack comprising:
        a high-k dielectric layer located on the silicon substrate;
        a first gate metal layer located over the high-k dielectric layer, the first gate metal layer consisting of titanium nitride and having a thickness, wherein the thickness determines a work function of the FET;
        a threshold voltage tuning layer located between the high-k dielectric layer and the first gate metal layer, wherein a thickness of the threshold voltage tuning layer is based on the thickness of the first gate metal layer;
        an oxygen barrier layer located over the first gate metal layer, the oxygen barrier layer comprising tantalum nitride (TaN) formed by atomic layer deposition (ALD); and
        a second gate metal layer located over the oxygen barrier layer;
    forming a polysilicon layer over the gate stack;
    annealing the gate stack and the silicon substrate;
    removing the polysilicon layer; and
    forming a metal contact over the gate stack.

2. The method of claim 1, wherein the high-k dielectric layer comprises hafnium oxide, and the metal contact comprises one of aluminum and tungsten.

3. The method of claim 1, wherein the annealing activates the FET, and is performed at a temperature of at least 1000° C.

4. The method of claim 1, wherein the FET includes a quarter-gap n-type FET, and wherein the thickness of the first gate metal layer is from 35 angstroms to 100 angstroms.

5. The method of claim 1, wherein the FET includes a quarter-gap p-type FET, and wherein thickness of the first gate metal layer is 20 angstroms.

6. The method of claim 1, wherein the FET includes a mid-gap FET, and wherein the thickness of first gate metal layer is from 20 angstroms to 35 angstroms.

7. The method of claim 1, wherein the thickness of the first gate metal layer is 20 angstroms, and wherein the FET comprises a mid-gap FET.

8. The method of claim 1, wherein the thickness of the first gate metal layer is 20 angstroms, and wherein the FET comprises a quarter-gap n-type FET.

9. The method of claim 1, wherein the threshold voltage tuning layer comprises a layer of aluminum.

10. The method of claim 9, wherein the thickness of the first gate metal layer is from 35 angstroms to 100 angstroms, and wherein the FET comprises a mid-gap FET.

11. The method of claim 1, wherein t the thickness of he first gate metal layer is 20 angstroms, the second gate metal layer has a thickness from 35 angstroms to 100 angstroms, and the FET comprises a quarter-gap n-type FET.

12. The method of claim 11, further including removing the second gate metal layer and the oxygen barrier layer after removing the polysilicon layer to form a quarter-gap p-type FET.

13. The method of claim 1, wherein the threshold voltage tuning layer comprises aluminum.

14. The method of claim 13, wherein the thickness of the first gate metal layer is 20 angstroms, the second gate metal layer has a thickness from 35 angstroms to 100 angstroms, and the FET comprises a mid-gap FET.

15. The method of claim 1, wherein the second gate metal layer comprises titanium nitride.

* * * * *